(12) United States Patent
Mikami et al.

(10) Patent No.: US 10,777,904 B2
(45) Date of Patent: Sep. 15, 2020

(54) RADIO WAVE ABSORBER AND MANUFACTURING METHOD OF RADIO WAVE ABSORBER

(71) Applicant: FUJIFILM Corporation, Tokyo (JP)

(72) Inventors: Tatsuo Mikami, Kanagawa (JP); Hirotoshi Yoshizawa, Kanagawa (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/580,103

(22) Filed: Sep. 24, 2019

(65) Prior Publication Data

US 2020/0021036 A1    Jan. 16, 2020

Related U.S. Application Data

(63) Continuation of application No. PCT/JP2018/011525, filed on Mar. 22, 2018.

(30) Foreign Application Priority Data

Mar. 30, 2017    (JP) ................................ 2017-068887

(51) Int. Cl.
*H01Q 17/00*    (2006.01)
*B65D 83/28*    (2006.01)
*G02B 1/118*    (2015.01)

(52) U.S. Cl.
CPC ........... *H01Q 17/008* (2013.01); *B65D 83/28* (2013.01); *H01Q 17/007* (2013.01);
(Continued)

(58) Field of Classification Search
CPC ............. H01L 23/552; H01J 2329/892; H01Q 17/004; H01Q 17/008; H01Q 17/00;
(Continued)

(56) References Cited

U.S. PATENT DOCUMENTS 4,023,174 A    5/1977    Wright
8,164,245 B2 *    4/2012    Nishida ................... H01J 11/12
                                                                313/483
(Continued)

FOREIGN PATENT DOCUMENTS

EP    1137103 A2    9/2001
GB    609060 A    9/1948
(Continued)

OTHER PUBLICATIONS

International Search Report dated Jun. 12, 2018 from the International Searching Authority in counterpart International Application No. PCT/JP2018/011525.
(Continued)

*Primary Examiner* — Olumide Ajibade Akonai
(74) *Attorney, Agent, or Firm* — Sughrue Mion, PLLC

(57) ABSTRACT

Provided is a radio wave absorber including: a support; a first radio wave absorption layer having a flat plate shape that is disposed on a surface of the support and includes a radio wave absorption material and a binder; and second radio wave absorption layers that are erected on a surface of the first radio wave absorption layer, include a radio wave absorption material and a binder, and are conical protrusions having bottom surfaces of which outer peripheral portions are in contact with each other, in which a distance between apexes of the conical protrusions adjacent to each other is 0.5 mm to $\lambda^a$ mm, in a case where a wavelength of a radio wave to be absorbed is set as $\lambda^a$ mm, and a manufacturing method of a radio wave absorber.

4 Claims, 3 Drawing Sheets

(52) U.S. Cl.
CPC ....... *B01J 2219/1946* (2013.01); *G02B 1/118* (2013.01); *H01Q 17/001* (2013.01)

(58) Field of Classification Search
CPC .... H01Q 17/001; H01Q 15/14; H01Q 17/007; H05K 9/00; H05K 9/0081; H05K 9/0088; G02B 1/118; G02B 1/11; G02B 5/045; G02B 6/0055; G02B 1/111; G02B 1/18; G02B 5/003; G02B 5/287; G02B 6/0036
See application file for complete search history.

(56) References Cited

U.S. PATENT DOCUMENTS

| | | | | |
|---|---|---|---|---|
| 2001/0030638 A1* | 10/2001 | Kashima | ........... | F21V 5/00 345/102 |
| 2001/0032701 A1* | 10/2001 | Kawanaka | ........... | H01Q 17/00 156/276 |
| 2003/0180476 A1* | 9/2003 | Yamashita | ........... | G02B 1/118 428/1.1 |
| 2007/0131928 A1* | 6/2007 | Kwak | ........... | H01L 51/5281 257/40 |
| 2008/0042926 A1* | 2/2008 | Egi | ........... | C09K 11/06 345/32 |
| 2008/0129183 A1* | 6/2008 | Egi | ........... | H01J 11/12 313/483 |
| 2008/0130122 A1* | 6/2008 | Egi | ........... | G02B 5/003 359/613 |
| 2008/0158682 A1* | 7/2008 | Egi | ........... | G02F 1/133502 359/601 |
| 2009/0226631 A1* | 9/2009 | Yamazaki | ........... | H05B 33/10 427/510 |
| 2012/0078189 A1* | 3/2012 | Ogawa | ........... | A61M 37/0015 604/173 |
| 2015/0298251 A1* | 10/2015 | Li | ........... | B23K 26/142 65/23 |

FOREIGN PATENT DOCUMENTS

| | | |
|---|---|---|
| JP | 7-193388 A | 7/1995 |
| JP | 52-106048 U | 8/1997 |
| JP | 2003241761 A | 8/2003 |
| JP | 2004146801 A | 5/2004 |
| JP | 2005286195 A | 10/2005 |
| JP | 2006-351693 A | 12/2006 |
| JP | 2011-005245 A | 1/2011 |
| WO | WO-03056894 A1 * | 7/2003 ........... H01Q 17/004 |

OTHER PUBLICATIONS

International Preliminary Report on Patentability dated Oct. 1, 2019 from the International Bureau in counterpart International Application No. PCT/JP2018/011525.
Written Opinion dated Jun. 12, 2018 from the International Bureau in counterpart International Application No. PCT/JP2018/011525.
Notice of Reason for Refusal dated Mar. 10, 2020 from the Japanese Patent Office in application No. 2019-509683.
Communication dated Mar. 5, 2020 from the European Patent Office in application No. 18776666.2.

* cited by examiner

RADIO WAVE ABSORBER AND MANUFACTURING METHOD OF RADIO WAVE ABSORBER

CROSS-REFERENCE TO RELATED APPLICATIONS

This application is a continuation application of International Application No. PCT/JP2018/011525, filed Mar. 22, 2018, the disclosure of which is incorporated herein by reference in its entirety. Further, this application claims priority from Japanese Patent Application No. 2017-068887, filed Mar. 30, 2017, the disclosure of which is incorporated herein by reference in its entirety.

BACKGROUND OF THE INVENTION

1. Field of the Invention

The present disclosure relates a radio wave absorber and a manufacturing method of a radio wave absorber.

2. Description of the Related Art

In general, in a device or equipment generating radio waves such as a communication apparatus or a radar (hereinafter, may be collectively referred to as electronic equipment), a technology of including a radio wave absorption material which absorbs unnecessary electromagnetic waves which may cause a malfunction in the vicinity of the device or equipment, is often performed. More specifically, as the method of preventing radiation noise leaking to outside, a method of surrounding a device which is a noise generation source using a metal plate or a shielding material is known.

A radio wave absorber is used for preventing radiation noise of a radio wave radiated from electronic equipment from leaking to outside.

In general, a radio wave shielding material used for shielding radiation noise of a radio wave radiated from electronic equipment, for example, a metal plate or a shielding material including metal particles may cause a malfunction in the electronic equipment due to reflected electromagnetic wave due to irregular reflection of the radiation noise of radio wave on a surface.

Accordingly, for the prevention of leakage of noise radiated from electronic equipment, a method of using a radio wave absorber including a radio wave absorption material, instead of the radio wave shielding material is attempted.

As the radio wave absorber, a radio wave absorber capable of mixing and dissolving waste ferrite and a waste synthetic resin material to mold in a desired shape has been proposed (see JP2006-351693A). According to this radio wave absorber, the manufacturing cost is low, and for example, the radio wave absorber is easily formed in a region having a desired installation area. In addition, various kinds of ruggedness are provided on a surface of the radio wave absorber on a side absorbing radio waves.

SUMMARY OF THE INVENTION

However, in the radio wave absorber disclosed in JP2006-351693A, waste ferrite is used, and accordingly, dissolving equipment and a molding die of the waste synthetic resin with irregular quality are necessary, and for example, in a case where a radio wave absorber having a shape having ruggedness on the surface is manufactured, and the manufacturing step is complicated.

In addition, according to the studies of the inventors, it is found that, in a case of using the waste ferrite as the radio wave absorption material, sufficient radio wave absorbability may not be obtained depending on a surface shape of the radio wave absorber.

In a case where a content of the radio wave absorption material with respect to a binder is increased, in order to improve radio wave absorbability of the radio wave absorber, the molding becomes more complicated, and a larger problem during the manufacturing is caused.

An object of one embodiment of the invention is to provide a radio wave absorber having excellent radio wave absorbability, in which irregular reflection of radio waves due to a ruggedness structure of a surface of a radio wave absorber is prevented.

Another object of one embodiment of the invention is to provide a manufacturing method of a radio wave absorber capable of easily manufacturing a radio wave absorber having excellent radio wave absorbability.

Means for achieving the objects include the following aspects.

<1> A radio wave absorber comprising: a support; a first radio wave absorption layer having a flat plate shape that is disposed on a surface of the support and includes a radio wave absorption material and a binder; and second radio wave absorption layers that are erected on a surface of the first radio wave absorption layer, include a radio wave absorption material and a binder, and are conical protrusions having bottom surfaces of which outer peripheral portions are in contact with each other, in which a distance between apexes of the conical protrusions adjacent to each other is 0.5 mm to $\lambda^a$ mm, in a case where a wavelength of a radio wave to be absorbed is set as $\lambda^a$ mm.

<2> The radio wave absorber according to <1>, in which a height of the conical protrusion of the second radio wave absorption layer is $0.5\lambda^a$ mm to $9\lambda^a$ mm, in a case where a wavelength of a radio wave to be absorbed is set as $\lambda^a$ mm.

<3> The radio wave absorber according to <1> or <2>, in which the second radio wave absorption layer is formed of a single radio wave absorption layer formation composition including a radio wave absorption material and a binder.

<4> The radio wave absorber according to any one of <1> to <3>, in which the radio wave absorption material is a magnetic material.

<5> A manufacturing method of a radio wave absorber, the method comprising: a step of forming a first radio wave absorption layer having a flat plate shape on a surface of a support by using a radio wave absorption layer formation composition including a radio wave absorption material; and a step of ejecting a second radio wave absorption layer formation composition including a radio wave absorption material, a binder, and a solvent onto a surface of the first radio wave absorption layer from a nozzle, and moving the nozzle in a direction away from the surface of the first radio wave absorption layer, to form a second radio wave absorption layer having a conical shape.

According to one embodiment of the invention, it is possible to provide a radio wave absorber having excellent radio wave absorbability, in which irregular reflection of radio waves due to an effect of an incidence angle of a radio wave is prevented.

According to another embodiment of the invention, it is possible to provide a manufacturing method of a radio wave absorber capable of simply manufacturing a radio wave absorber having excellent radio wave absorbability.

DESCRIPTION OF THE PREFERRED EMBODIMENTS

Figure 1A:
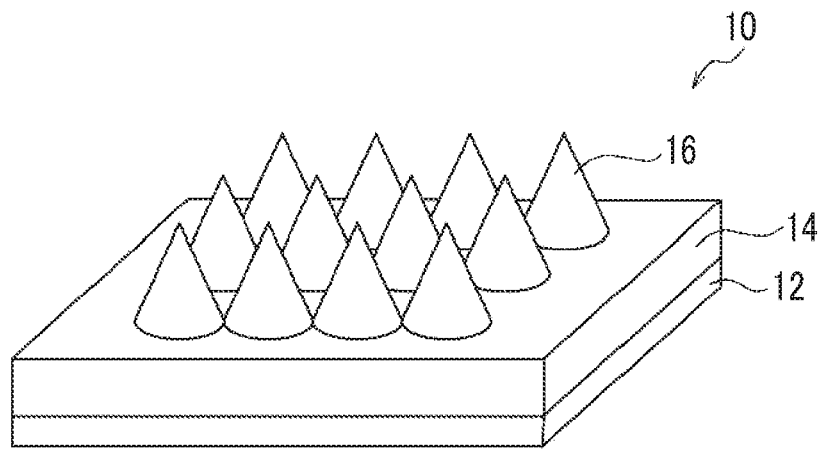
FIG. 1A is a perspective view of a radio wave absorber according to one embodiment of the invention.

Hereinafter, an example of embodiments of the disclosure will be described in detail, the description of constituent elements described hereinafter is an example (representative example) of the embodiments of the invention, and the invention is not limited to these contents. Various changes can be performed within a range of gist.

A range of numerical values shown using "to" in the disclosure means a range including numerical values before and after "to" as a minimum value and a maximum value.

In the specification, in a case where a plurality of substances corresponding to each component are present in a composition, the amount of each component in the composition means a content of the plurality of substances, unless otherwise noted.

In the range of numerical values disclosed in stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the specification, a combination of preferred aspects is a more preferred aspect.

In the disclosure, an "acryl resin" means a resin including a structural unit derived from an acryl monomer having a (meth)acryloyl group. The "(meth)acryloyl group" has a concept including a methacryloyl group and an acryloyl group.

In the disclosure, a term "step" does not only mean an individual step, but also include a case a step cannot be clearly differentiated from another step, in a case where the desired object of the step is achieved.

<Radio Wave Absorber>

A radio wave absorber of the disclosure is a radio wave absorber including: a support; a first radio wave absorption layer having a flat plate shape that is disposed on a surface of the support and includes a radio wave absorption material and a binder; and a second radio wave absorption layers that are erected on a surface of the first radio wave absorption layer, include a radio wave absorption material and a binder, and are conical protrusions having bottom surfaces of which outer peripheral portions are in contact with each other.

A reason for the radio wave absorber of the disclosure exhibiting such effect is not clear, but the inventors have surmised as follows.

The radio wave absorber of the disclosure includes the first radio wave absorption layer having a flat plate shape and the second radio wave absorption layer having a conical shape on the support. In a case of providing only the flat plate-shaped absorber layer, a difference in refractive index is generated on an interface between air and the absorber, and accordingly, the reflection occurs on the surface of the absorber and radio wave absorbability is reduced. Meanwhile, by providing the conical absorption layer on the flat plate-shaped absorption layer, the refractive index slowly changes on the interface between air and the absorber, and the surface reflection of the incident radio wave is prevented. Accordingly, by providing the conical absorption layer, a high return loss is obtained.

In a case of providing the conical absorption layer, diffracted light is hardly generated by reducing a distance between apexes of conical protrusion to be smaller than a wavelength of the radio wave. Accordingly, the incident radio wave is not reflected on the surface of the radio wave absorber, is incident into the radio wave absorber, and is efficiently absorbed by the inner portion of the radio wave absorber, and a high return loss is obtained. In a case where the distance apexes of conical protrusion of the absorption layer is greater than a wavelength of the radio wave, diffracted light is easily generated, and accordingly, attenuation of the radio wave incident to the radio wave absorber is insufficient.

Therefore, it is thought that, the radio wave absorber of the disclosure including the first radio wave absorption layer and the second radio wave absorption layer is hardly affected by an incidence angle of the radio wave, and radio wave absorbability is excellent in a range of wide incidence angle of the radio wave.

The disclosure is not limited to the putative mechanism.

In the disclosure, the "radio wave absorbability" is evaluated by measuring a return loss (dB) in a range of an incidence angle of 30° and a predetermined frequency (GHz) by a free space method.

A higher numerical value of the return loss means excellent radio wave absorbability and it is preferably equal to or greater than 20.0 dB.

Hereinafter, the radio wave absorber of the disclosure will be described with reference to the drawings. The drawings show the embodiment of the radio wave absorber of the disclosure, and the disclosure is not limited to the embodiment described below.

Figure 1B:
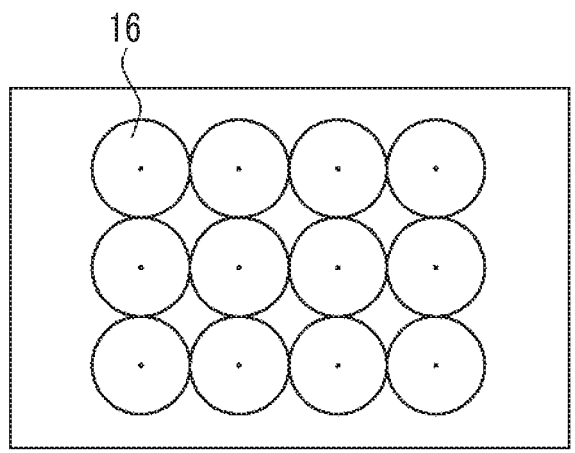
FIG. 1B is a plan view of the radio wave absorber according to one embodiment of the invention.
Figure 1C:
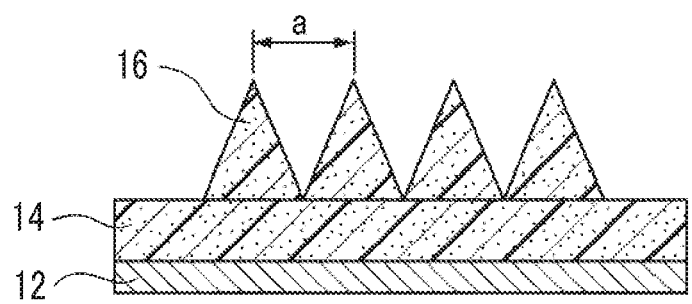
FIG. 1C is a schematic cross-sectional view of the radio wave absorber according to one embodiment of the invention.

FIG. 1A is a perspective view of a radio wave absorber according to the embodiment of the invention, FIG. 1B is a plan view thereof and FIG. 1C is a schematic cross-sectional view thereof.

As shown in FIG. 1A, the radio wave absorber 10 includes a support 12, and a first radio wave absorption layer 14 having a flat plate shape on a surface of the support 12. The radio wave absorber includes the second radio wave absorption layers 16 having a conical shape that are erected on the surface of the first radio wave absorption layer, and include a radio wave absorption material and a binder, and are conical protrusions having bottom surfaces of which outer peripheral portions are in contact with each other on the surface of the first radio wave absorption layer.

In the radio wave absorber 10 shown in FIG. 1A, the conical protrusions are provided in parallel in a longitudinal direction and a width direction.

In FIGS. 1A to 3B, the constituent elements shown using the same reference numeral mean the same constituent elements.

Figure 2A:
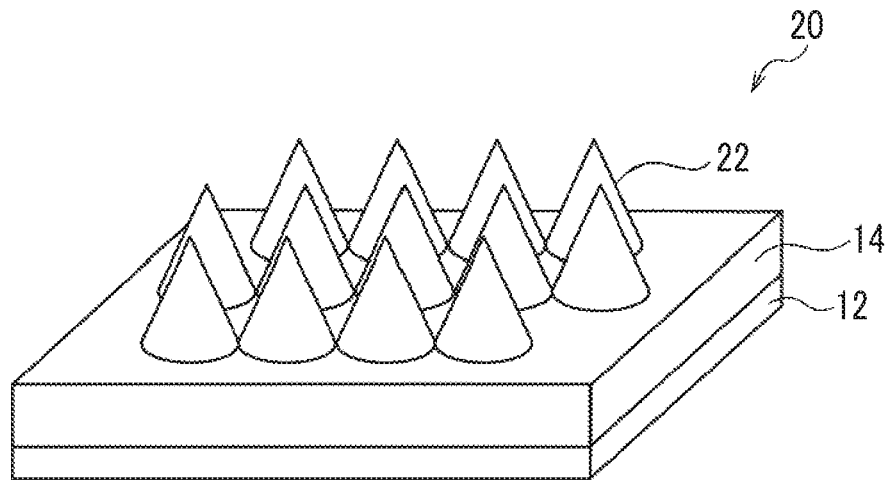
FIG. 2A is a perspective view of a radio wave absorber according to the other embodiment of the invention.
Figure 2B:
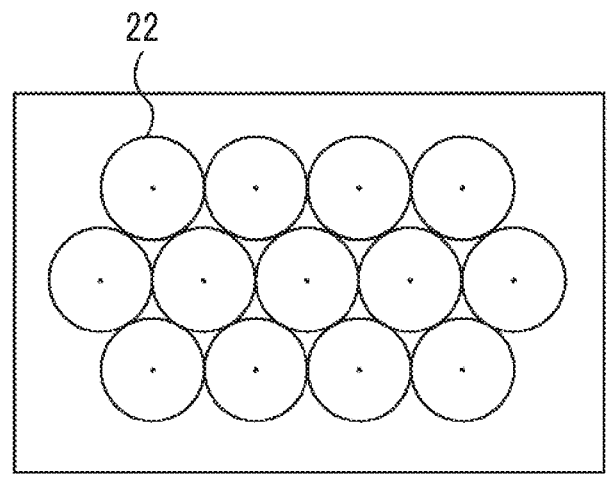
FIG. 2B is a plan view of the radio wave absorber according to the other embodiment of the invention.
Figure 2C:
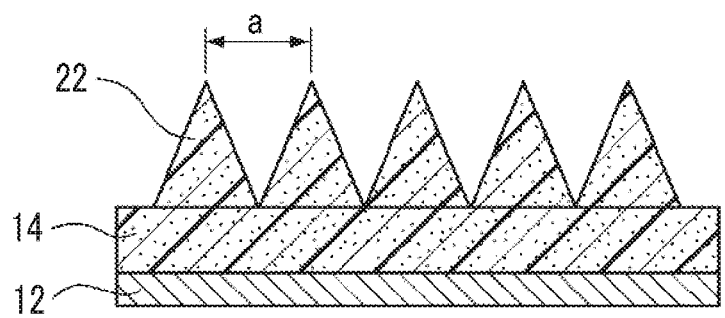
FIG. 2C is a schematic cross-sectional view of the radio wave absorber according to the other embodiment of the invention.

FIG. 2A is a perspective view of a radio wave absorber according to another embodiment of the invention, FIG. 2B is a plan view thereof, and FIG. 2C is a schematic cross-sectional view thereof.

In a radio wave absorber 20 shown in FIG. 2A, the support 12 and the first radio wave absorption layer 14 having a flat plate shape on the surface of the support 12 are the same as those in the radio wave absorber 10 shown in FIG. 1.

In the radio wave absorber 20 shown in FIG. 2A, the formation position of the conical protrusion of the second radio wave absorption layer 22 erected on the surface of the first radio wave absorption layer is different from the aspect shown in FIG. 1A, and the conical protrusions are disposed in parallel in a width direction and are formed in the longitudinal direction to be shifted by a length of ½ of a diameter of the outer peripheral portion of the bottom surface of the conical protrusion.

[First Radio Wave Absorption Layer Having Flat Plate Shape]

The radio wave absorber of the disclosure includes the first radio wave absorption layer having a flat plate shape disposed at least on one surface of the support which will be described later.

(Radio Wave Absorption Material)

The first radio wave absorption layer includes a radio wave absorption material.

The first radio wave absorption layer can be obtained by using a radio wave absorption layer formation composition including a radio wave absorption material and a binder.

The radio wave absorption material of the first radio wave absorption layer is not particularly limited, as long as it can absorb the radio wave.

As an example of the radio wave absorption material, a magnetic material, a dielectric material, or a conductive material is used.

The magnetic material that can be used as the radio wave absorption material is not particularly limited. Examples of the magnetic material include powders of metal such as Fe, Co, and Ni, an alloy including these metals (so-called, magnetic alloy), compounds including these metals (oxide (so-called magnetic oxide), nitride (so-called magnetic nitride), carbide (so-called magnetic carbide), and the like).

Among these, as the magnetic material, magnetic oxide is preferable, and magnetic oxide having Fe as a main component is more preferable, from viewpoints of corrosion resistance. Here, the "main component" means a component, the content of which is 50 mass % or more in terms of a constituent percentage of the magnetic oxide.

Examples of the magnetic oxide having Fe as a main component include hexagonal ferrite (barium ferrite, strontium ferrite, or the like), magnetite, and γ-ferrite.

The magnetic material may include elements such as Al, Si, S, Sc, Ti, V, Cu, Y, Mo, Rh, Pd, Ag, Sn, Sb, Te, Ba, Ta, W, Re, Au, Bi, La, Ce, Pr, Nd, P, Zn, Sr, and B, in addition to the metal such as Fe, Co, and Ni.

Examples of the dielectric material that can be used as the radio wave absorption material include barium titanate powder, titanium oxide powder, and various resin fibers (polyethylene-based fiber).

Examples of the conductive material that can be used as the radio wave absorption material include conductive carbon powder, various metal powders (nickel, copper, tin powder, and the like), and various metal fibers (nickel, copper, tin fibers).

Among these, as the radio wave absorption material, the magnetic material is preferable. By using the magnetic material as the radio wave absorption material, it is possible to efficiently increase the absorption of the radio wave at a desired frequency.

A content of the wave radio absorption material in the first radio wave absorption layer is not particularly limited, and is, for example, preferably equal to or greater than 5 mass %, more preferably equal to or greater than 20 mass %, and even more preferably equal to or greater than 50 mass % with respect to a total solid content of the absorber, from a viewpoint of ensuring excellent absorption characteristics.

The content of the radio wave absorption material in the first radio wave absorption layer is, for example, preferably equal to or smaller than 98 mass %, more preferably equal to or smaller than 95 mass %, and even more preferably equal to or smaller than 92 mass % with respect to a total solid content of the absorber, from viewpoints of manufacturing suitability and durability.

By adjusting the kind and content of the radio wave absorption material included in the first radio wave absorption layer, it is possible to select a frequency band of the radio wave to be absorbed according to the purpose.

(Binder)

The first radio wave absorption layer includes a binder.

In the specification, the "binder" of the first radio wave absorption layer is a general term of a substance which is in a state where the radio wave absorption material is dispersed and can be formed in a state of the first radio wave absorption layer and the second radio wave absorption layer which will be described later.

The binder is not particularly limited, as long as it can disperse the radio wave absorption material and can form the aspect of the first radio wave absorption layer and the second radio wave absorption layer which will be described later.

As the binder, synthesis rubbers such as an acryl rubber obtained by copolymerization of acrylic acid ester (acrylic acid ester of ethyl acrylate, butyl acrylate, or 2-ethylhexyl acrylate) and other monomer; an ethylene-propylene rubber obtained by a reaction of ethylene and propylene in a solvent; a butyl rubber obtained by copolymerization of isobutylene and isoprene; a styrene butadiene rubber obtained by copolymerization of butadiene and styrene; an acrylonitrile butadiene rubber obtained by copolymerization of acrylonitrile and butadiene; and a silicone rubber are preferable, from viewpoints of mixing properties or adhesiveness with the radio wave absorption material, impact resistance, durability and weather fastness during a long-term use.

The first radio wave absorption layer may include only one kind of binder and may include two or more kinds thereof.

A content of the binder in the first radio wave absorption layer is not particularly limited, and is, for example, preferably equal to or greater than 2 mass %, more preferably equal to or greater than 5 mass %, and even more preferably equal to or greater than 10 mass %, with respect to a total solid content of the first radio wave absorption layer, from a viewpoint of easily controlling dispersibility of the radio wave absorption material or a bonding power between the radio wave absorption materials.

In addition, the content of the binder in the first radio wave absorption layer is, for example, preferably equal to or smaller than 90 mass %, more preferably equal to or smaller than 70 mass %, and even more preferably equal to or smaller than 50 mass %, with respect to a total solid content of the first radio wave absorption layer, from a viewpoint of ensuring excellent radio wave absorption performance.

The first radio wave absorption layer may include components other than the radio wave absorption material and the binder (so-called other components), if necessary.

Examples of the other components that may be included in the first radio wave absorption layer include a curing agent, a crosslinking agent, a reaction initiator, a plasticizer, and a dispersing agent.

A thickness of the first radio wave absorption layer is not particularly limited, and is, for example, preferably 0.1 mm to 500 mm, more preferably 0.5 mm to 100 mm, and even more preferably 1 mm to 30 mm, from viewpoints of ease of handling and ensuring installation space.

[Support]

The radio wave absorber of the disclosure includes a support.

In the radio wave absorber of the disclosure, the support contributes to retaining of a form of the absorber.

The support is not particularly limited, and a well-known support can be used.

Examples of the material configuring the support include a metal plate (plate of metal such as aluminum, zinc, or copper), a plastic sheet [sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which metal described above is laminated or deposited.

In a case where the support is a plastic sheet, for example, as the support, a sheet formed by a well-known film forming method (T tie method or an inflation method) using at least one kind of the materials described above may be used or a commercially available product may be used.

Among these, as the material configuring the support, a metal plate is preferable, and an aluminum plate is more preferable, from viewpoints of durability and retaining of a form of the absorber.

In a case of using a metal plate as the support, it is advantageous that the radio wave incident from the first radio wave absorption layer having a flat plate shape is reflected, the reflected radio wave and the incident radio wave cancel each other, and the absorbability of the radio wave is more improved.

In the second radio wave absorption layer which will be described later, by slowly changing the diameter with respect to the height caused by the shape, the interface between air and the substance recognized with the radio wave becomes unclear, and accordingly, the reflection on the surface of the absorber hardly occurs, and the absorbed radio wave is attenuated in the shape of the cone. Therefore, means for canceling the reflection on the surface of the absorber are not particularly necessary, and thus, the support is not necessarily metal.

The shape, the structure, or the size of the support can be suitably selected according to the purpose.

The shape of the support is, for example, a flat plate shape.

The structure of the support may be a single-layered structure or a laminated structure of two or more layers.

The size of the support, that is, the size of the support observed in a normal direction can be suitably selected, in accordance with the desired size of the radio wave absorber according to the purpose.

The size of the support is not particularly limited, and is normally approximately 0.01 mm to 10 mm, for example, preferably 0.02 mm to 3 mm and more preferably 0.05 mm to 1 mm, from a viewpoint of handleability.

In a case where the support is, for example, a rigid plate-shaped material such as a metal plate or a resin flat plate, a housing or a radio wave shielding plate as the radio wave absorber having radio wave absorbability can be formed by the support.

In a case where the support is, for example, a plastic sheet having flexibility or a metal-laminated plastic, the radio wave absorber is easily formed in any region, for example, a region having a curved surface.

[Second Radio Wave Absorption Layer Having Conical Shape]

The radio wave absorber of the disclosure includes the second radio wave absorption layers having a conical shape that are erected on the surface of the first radio wave absorption layer described above, include a radio wave absorption material and a binder, and are conical protrusions having bottom surfaces of which outer peripheral portions are in contact with each other.

As shown in FIGS. 1A, 1B, 2A, and 2B, the second radio wave absorption layer is formed of conical protrusions in which the adjacent outer peripheral portions on the bottom surface are in contact to each other. In a case where a wavelength of the radio wave to be absorbed is set as $\lambda^a$, a distance between apexes of the conical adjacent protrusions is 0.5 mm to $\lambda^a$ mm, and accordingly, radio wave absorbability becomes excellent. The distance between apexes of the conical adjacent protrusions is a distance represented by a, in the cross-sectional view shown in FIG. 1C.

As shown in FIG. 1C and FIG. 2C, the distance a between the apexes of the protrusions is the same as a diameter of the bottom surface of the conical protrusion.

A distance between apexes of the conical protrusions which is the second radio wave absorption layers is 0.5 mm to $\lambda^a$ mm, preferably $0.2\lambda^a$ mm to $0.8\lambda^a$ mm, and more preferably $0.3\lambda^a$ mm to $0.5\lambda^a$ mm.

In the second radio wave absorption layer, it is advantageous that, in the conical protrusion, a reflectivity of the inner portion caused by the shape changes due to a change of the diameter with respect to the height, and the radio wave to be absorbed is attenuated in the shape of the cone. Among these, by setting the distance between the apexes of the adjacent conical protrusions in the range described above, the effect becomes significant.

In general, properties of the radio wave are represented by a frequency. A relationship between the frequency and the wavelength of the radio wave at the frequency, that is, the length of one cycle is represented by the following equation.

$$\lambda = C/F \quad \text{[Equation]}$$

In the equation, $\lambda$ represents a wavelength (mm), C represents a velocity of light $[3\times10^{11}]$ (mm), and F represents a frequency (GHz).

In general, as the height of the conical protrusion is high, the radio wave absorbability increases, but in a case where the height of the protrusion increases, the thickness of the radio wave absorber increases, handleability is deteriorated, and a portion to be installed is limited.

In the radio wave absorber of the disclosure, by setting the distance between the adjacent conical protrusions in the suitable range described above, excellent radio wave absorbability is obtained. Accordingly, even in a case where the height of the protrusion of the second radio wave absorption layer is lower than a height of a protrusion of a well-known radio wave absorber having ruggedness on the surface thereof, excellent effect of the disclosure can be exhibited.

More specifically, for example, in a case where the wavelength of the radio wave to be absorbed is set as $\lambda^a$, the height of the conical protrusion of the second radio wave absorption layer is set as $0.5\lambda^a$ mm to $9\lambda^a$ mm, and accordingly, more excellent radio wave absorbability can be obtained. The height of the conical protrusion is preferably $0.5\lambda^a$ mm to $9\lambda^a$ mm, more preferably $1.0\lambda^a$ mm to $4.0\lambda^a$ mm, and even more preferably $1.0\lambda^a$ mm to $1.5\lambda^a$ mm.

For example, in JP2006-351693 described above, it is disclosed that, regarding a relationship between the frequency of the radio wave, the wavelength, and the height of the conical protrusion, in a case where the frequency is 110 GHz (wavelength of 2.73 mm), sufficient attenuation effect of the radio wave is obtained at the height of 25 mm to 90 mm. That is, the height is 9.17 to 33.0 times the wavelength. On the other hand, according to the examples of the disclosure which will be described later, it is confirmed that, in a case where the frequency is 40 GHz (wavelength of 7.5 mm) and in a case where the frequency is 50 GHz (wavelength of 6.0 mm), sufficient attenuation effect of the radio wave is obtained at the height of 7 mm. That is, the height is 0.93 to 1.16 times the wavelength. Therefore, it is confirmed that, even in a case where the height of the conical protrusion of the second wave radio absorption layer is reduced, the radio wave absorber of the disclosure shows sufficient radio wave absorbability in practice. In a case where the height of the protrusion is higher, more excellent radio wave absorbability is obtained.

The second radio wave absorption layer is preferably formed of the single radio wave absorption layer formation composition including the radio wave absorption material and the binder.

The conical protrusion of the second radio wave absorption layer is formed of the single radio wave absorption layer formation composition including the radio wave absorption material and the binder, that is, the inner portion of the conical protrusion is densely filled with the radio wave absorption layer formation composition including the radio wave absorption material, with a solid structure without including any space. Accordingly, in the second radio wave absorption layer of the disclosure, it is advantageous that the attenuation effect of the radio wave absorbed in the conical protrusion further increases, compared to a radio wave absorption layer including space therein or including different materials therein.

The second radio wave absorption layer includes the radio wave absorption material and the binder.

(Radio Wave Absorption Material)

The radio wave absorption material included in the second radio wave absorption layer is not particularly limited, and the same radio wave absorber included in the first radio wave absorption layer described above is used.

The radio wave absorption material included in the second radio wave absorption layer may be the same as or different from the radio wave absorption material included in the first radio wave absorption layer.

Those are preferably the same, from the manufacturing suitability.

A content of the radio wave absorption material in the second radio wave absorption layer is not particularly limited. The content of the radio wave absorption material in the second radio wave absorption layer is the same as the content of the radio wave absorption material in the first radio wave absorption layer, and the preferred range is also the same.

(Binder)

The binder included in the second radio wave absorption layer is not particularly limited, as long as the radio wave absorption material can be dispersed, and an absorption layer having any thickness can be formed in a state where the radio wave absorption material is dispersed in the binder.

As the binder, the same material exemplified as the binder in the first radio wave absorption layer described above can be used, and the same applies to the preferred example.

The second radio wave absorption layer may include one kind of the binder or may include two or more kinds thereof.

The binder included in the second radio wave absorption layer may be the same as or different from the binder included in the first radio wave absorption layer described above.

A content of the binder in the second radio wave absorption layer is not particularly limited. For example, the content of the binder in the second radio wave absorption layer can be the same content as in the first radio wave absorption layer, and the range of the preferred content is also the same.

<Manufacturing Method of Radio Wave Absorber>

The manufacturing method of the radio wave absorber of the disclosure is not particularly limited.

Among these, the manufacturing method of the radio wave absorber of the disclosure shown below is preferably applied to the manufacturing of the radio wave absorber of the disclosure described above.

The manufacturing method of the radio wave absorber of the disclosure (hereinafter, also referred to as the "manufacturing method of the disclosure") includes a step of forming a first radio wave absorption layer having a flat plate shape on a surface of a support by using a radio wave absorption layer formation composition including a radio wave absorption material (step (A)); and a step of ejecting a second radio wave absorption layer formation composition including a radio wave absorption material, a binder, and a solvent onto a surface of the first radio wave absorption layer from a nozzle, and moving the nozzle in a direction separated from the surface of the first radio wave absorption layer, to form a second radio wave absorption layer having a conical shape (step (B)).

The manufacturing method of the disclosure may include other steps, if necessary.

Other steps, for example, include a step of drying the first radio wave absorption layer formed in the step (A) (step (C)), and a step of drying the second radio wave absorption layer obtained by the ejection in the step (B) (step (D)).

Hereinafter, the step of the manufacturing method of the disclosure will be described in detail.

The specific examples and preferred aspect of the components used in each step are the same as described in the section of the radio wave absorber described above, and therefore, the description here is omitted.

(Step of Forming First Radio Wave Absorption Layer Having Flat Plate Shape on Surface of Support by Using Radio Wave Absorption Layer Formation Composition Including Radio Wave Absorption Material: Step (A))

The step (A) is a step of forming the first radio wave absorption layer having a flat plate shape on the surface of the support.

As an example of the method of forming the first radio wave absorption layer, a method of applying a radio wave absorption layer formation composition including a radio wave absorption material and a binder, and if necessary, other components such as a solvent, onto a support, or a method of transferring a sheet-shaped first radio wave absorption layer formed by a radio wave absorption layer formation composition including a radio wave absorption material and a binder in advance onto a support.

The radio wave absorption layer formation composition may include other components such as a curing agent, a crosslinking agent, a reaction initiator, a plasticizer, and a dispersing agent, if necessary, in addition to the radio wave absorption material, the binder, and the solvent.

The solvent in the radio wave absorption layer formation composition is not particularly limited, and water, an organic solvent, or a mixed solvent of water and an inorganic solvent is used.

Examples of the organic solvent include alcohols such as methanol, ethanol, n-propanol, i-propanol, or methoxypropanol, ketones such as acetone, methyl ethyl ketone, or cyclohexane, tetrahydrofuran, acetonitrile, ethyl acetate, and toluene.

Among these, as the solvent, methyl ethyl ketone is preferable, from viewpoints of a comparatively low boiling point and ease of drying.

The radio wave absorption layer formation composition can be prepared, for example, by mixing the radio wave absorption material, the binder, the solvent, and if necessary, other components such as a curing agent, a crosslinking agent, a reaction initiator, a plasticizer, and a dispersing agent.

Each content of the radio wave absorption material and the binder in the radio wave absorption layer formation composition may be adjusted, so that each content of the radio wave absorption material and the binder in the absorber to be finally formed is the content described in the section of the radio wave absorber described above.

A content of the solvent in the radio wave absorption layer formation composition is not particularly limited, and is suitably selected, for example, in accordance with conditions of the kind or amount of the component blended in the radio wave absorption layer formation composition.

In the radio wave absorption layer formation composition, the wave absorption material, the binder, and the solvent may be simply mixed.

In a case of preparing the radio wave absorption layer formation composition, the wave absorption material, the binder, and the solvent may be mixed once or may be mixed while separately adding one component to the other component.

A method of mixing the wave absorption material, the binder, and the solvent is not particularly limited, and a method of mixing by stirring is used, for example.

Stirring means are not particularly limited, and a general stirring device can be used.

As the stirring device, a mixer such as a paddle mixer or an impeller mixer is used.

The stirring time is not particularly limited, and for example, can be suitably set in accordance with the kind of the stirring device or the composition of the absorber formation composition.

(Step of Drying First Radio Wave Absorption Layer Having Flat Plate Shape: Step (C))

A layer formed of the formed radio wave absorption layer formation composition can be dried, if necessary, to form a first radio wave absorption layer.

That is, the manufacturing method of the disclosure may further include a step of drying the first radio wave absorption layer (Step (C)).

As the method of drying the first radio wave absorption layer, a well-known method such as natural drying, heating drying, or reduced-pressure drying can be applied alone or in combination of plural methods.

As the method of drying the first radio wave absorption layer, for example, a method of applying a radio wave absorption layer formation composition onto a support, leaving the composition for several hours to 24 hours, and drying at a set temperature of 50° C. to 100° C. for 0.5 hours to 3 hours using a vacuum oven is used.

(Step of Ejecting Second Radio Wave Absorption Layer Formation Composition onto Surface of First Radio Wave Absorption Layer from Nozzle, and Moving Nozzle in Direction Separated from Surface of First Radio Wave Absorption Layer, to Form Second Radio Wave Absorption Layer Having Conical Shape (Step (B))

In the step (B), the second radio wave absorption layer formation composition is ejected onto the first radio wave absorption layer from the nozzle.

First, the nozzle is disposed on the surface of the first radio wave absorption layer in a contact or non-contact manner, and the second radio wave absorption layer formation composition is ejected from the nozzle. The ejected second radio wave absorption layer formation composition is contacted onto the surface of the first radio wave absorption layer, and the nozzle is moved in a direction separated from the surface of the first radio wave absorption layer, and accordingly, a conical protrusion is formed on the surface of the first radio wave absorption layer by the second radio wave absorption layer formation composition.

Figure 3A:
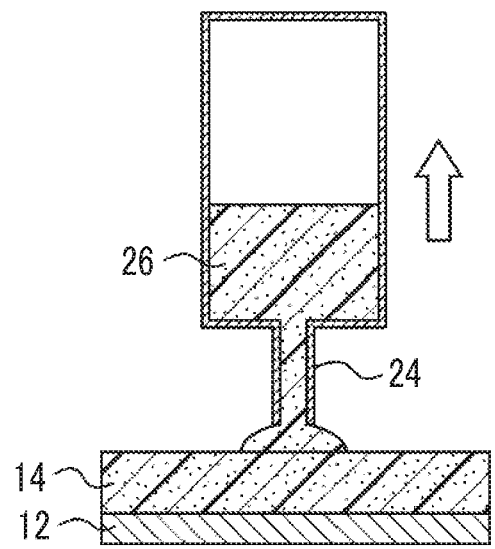
FIG. 3A is a schematic view for describing an example of a movement of a nozzle in a manufacturing method of a radio wave absorber of the disclosure and shows a state where ejection of a second radio wave absorption layer formation composition is started.
Figure 3B:
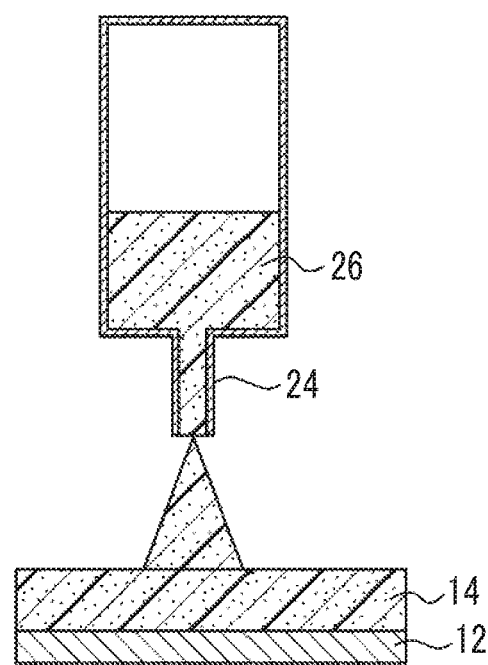
FIG. 3B is a schematic view for describing an example of a movement of a nozzle in a manufacturing method of a radio wave absorber of the disclosure and shows a state where the nozzle is separated from a first radio wave absorption layer.

FIGS. 3A and 3B are schematic views for describing an example of a movement of a nozzle in the manufacturing method of the radio wave absorber of the disclosure. FIG. 3A shows a state where a nozzle 24 is disposed on the surface of the first radio wave absorption layer 14 and the ejection of a second radio wave absorption layer formation composition 26 is started from the nozzle 24, and FIG. 3B shows a state where the nozzle 24 is separated from the first radio wave absorption layer 14 and the conical protrusion is formed by the second radio wave absorption layer formation composition 26.

By adjusting a nozzle diameter (inner diameter) of the nozzle used in the ejection, a material of the nozzle, the amount of the second radio wave absorption layer formation composition ejected from the nozzle, and the composition of the second radio wave absorption layer formation composition, it is possible to suitably select the size of the conical protrusion to be formed.

(Step of Drying Ejected Second Radio Wave Absorption Layer Formation Composition: Step (C))

The manufacturing method of the radio wave absorber of the disclosure may further include a step of drying the second radio wave absorption layer having a conical shape formed by ejecting the second radio wave absorption layer formation composition.

The drying method in the step (C) is not particularly limited. As the drying method, drying performed by contact heating of heating with a heater from a support side, or drying performed by non-contact heating by blowing warm air or carrying the absorber in a heating zone is used.

The heating condition is a condition is not particularly limited, as long as the solvent in the absorber formation composition is volatilized and the shape of the formed conical protrusion is maintained.

As an example of the drying method, a method of heating and drying the ejected second radio wave absorption layer at 40° C. to 250° C. for 1 hour to 48 hours.

In the step of drying the second radio wave absorption layer (Step (D)), the first radio wave absorption layer on which the second radio wave absorption layers are erected, may be dried, in addition to the second radio wave absorption layer. In this case, the step (C) which is the random step described above can be omitted.

By the manufacturing method of the disclosure, it is possible to easily manufacture the radio wave absorber of the disclosure described above.

EXAMPLES

Hereinafter, the invention will be described in detail with reference to examples, but the invention is not limited to the following examples, within a range not departing the gist thereof.

[Manufacturing of Radio Wave Absorber]

<Radio Wave Absorber 1>

The components shown in "composition of first radio wave absorption layer formation composition" below were stirred and mixed using a stirring device [product name: Awatori Rentaro ARE-310, Thinky Corporation] at a rotation rate of 2000 rotations per minute (rpm; the same applies hereinafter) for 10 minutes, to prepare the first radio wave absorption layer formation composition.

—Composition of First Radio Wave Absorption Layer Formation Composition—

Barium ferrite [model number: BMXF-5, BGRIMM (Beijing General Research Institute of Mining & Metallurgy), magnetic material]: 100.0 parts by mass Acrylonitrile butadiene rubber (NBR) [Grade: JSR N215SL, JSR, binder]: 11.7 parts by mass Cyclohexanone (Solvent): 134.1 parts by mass An ethylene propylene diene rubber (EPDM rubber, thickness: 2 mm) is cut to have a length of 75 mm and a width of 10 mm. Next, in a case where the cut EPDM rubber was observed on an aluminum plate (thickness: 0.1 mm) as the support in the normal direction of the support by using a double sided tape, four sheets were attached to the position for forming a square, and a square frame (die frame inner portion on the inner side is 65 mm×65 mm) which is a die for forming the absorption layer was manufactured.

Then, the first radio wave absorption layer formation composition was poured into the manufactured die, the surface was smoothed by using a stainless steel spatula in a state where the height of the liquid surface of the absorption layer formation composition is the same as the height of the die, and left for a day. After the leaving, the drying was performed using a vacuum oven at a set temperature of 80° C. for 1 hour.

Then, the manufactured die was removed with an EPDM rubber, an absorption layer (first radio wave absorption layer) having a square shape in a case of being observed in the normal direction of the support with a size of 65 mm×65 mm and a thickness of approximately 0.7 mm was formed on the aluminum plate which is the support.

The components shown in "composition of the second radio wave absorption layer formation composition" below were stirred and mixed using a stirring device [product name: Awatori Rentaro ARE-310, Thinky Corporation] at a rotation rate of 2000 rpm for 10 minutes, to prepare the second radio wave absorption layer formation composition.

—Composition of Second Radio Wave Absorption Layer Formation Composition—

Barium ferrite [model number: BMXF-5, BGRIMM, magnetic material]: 100.0 parts by mass Acrylonitrile butadiene rubber (NBR) [Grade: JSR N215SL, JSR, binder]: 11.7 parts by mass Methyl ethyl ketone (Solvent): 34.8 parts by mass A syringe having an inner diameter of the ejection nozzle of 0.5 mm was filled with the prepared second radio wave absorption layer formation composition. Next, the filled second radio wave absorption layer formation composition was started to be ejected onto the surface of the first radio wave absorption layer formed as described above, in a state where the nozzle tip is close to the surface of the first radio wave absorption layer, the nozzle tip was moved in a direction separated from the surface of the first radio wave absorption layer, and the ejection of the second radio wave absorption layer formation composition was stopped in the middle, and accordingly, a conical protrusion having a height of 7.5 mm was formed. The second radio wave absorption layer was formed by disposing the conical protrusions in horizontal and vertical directions at an interval of 3 mm.

After the formation, the second radio wave absorption layer was left for a day. After the leaving, the drying was performed using a vacuum oven at a set temperature of 80° C. for 1 hour, to obtain a radio wave absorber 1.

<Radio Wave Absorber 2>

A radio wave absorber 2 was manufactured in the same manner as in Example 1, except that the inner diameter of the ejection nozzle was set as 1.0 mm and the interval of the conical protrusions was set as 6 mm.

<Radio Wave Absorber 3>

A radio wave absorber 3 was manufactured in the same manner as in Example 1, except that the inner diameter of the ejection nozzle was set as 1.8 mm and the interval of the conical protrusions was set as 8 mm.

<Radio Wave Absorber 4>

A radio wave absorber 4 was manufactured in the same manner as in Example 1, except that the inner diameter of the ejection nozzle was set as 3.0 mm and the interval of the conical protrusions was set as 10 mm.

<Radio Wave Absorber 5>

In Example 1, the first radio wave absorption layer was formed and the second radio wave absorption layer was not formed, and a radio wave absorber 5 including only the first radio wave absorption layer having a flat plate shape on the support was obtained.

[Measurement of Return Loss]

A return loss (dB) of the radio wave absorbers 1 to 5 was measured.

Regarding the return loss (dB) of the radio wave absorber, a return loss (dB) at an incidence angle of 30° and a frequency of 40 GHz to 50 GHz was measured using Vector Network Analyzer (product name: MS4647B) manufactured by Anritsu Corporation and horn antenna (product name: RH19R) manufactured by KEYCOM Corp. by a free space method. A higher numerical value of the return loss means excellent radio wave absorbability and it is preferably greater than 20.0 dB, from a viewpoint of properties of the radio wave absorbability. At the frequency of 40 GHz to 50 GHz, a bandwidth in which the return loss of the radio wave absorber is greater than 20 dB is shown in Table 1.

TABLE 1

| | Bandwidth in which return loss is greater than 20 dB | Note |
| --- | --- | --- |
| Radio wave absorber 1 | 10 GHz | Example |
| Radio wave absorber 2 | 10 GHz | Example |
| Radio wave absorber 3 | 5 GHz | Comparative Example |
| Radio wave absorber 4 | 3 GHz | Comparative Example |
| Radio wave absorber 5 | 3 GHz | Comparative Example |

The radio wave absorber 1 having an interval between protrusions of 3 mm and the radio wave absorber 2 having an interval between protrusions of 6 mm are examples of the disclosure, in a range of a frequency of 40 GHz (wavelength $\lambda^a$ of radio wave: 7.5 mm) to a frequency of 50 GHz (wavelength $\lambda^a$ of radio wave: 6.0 mm).

As apparent from Table 1, according to the radio wave absorber 1 and the radio wave absorber 2 including the second radio wave absorption layers in which the intervals between protrusions are 3 mm and 6 mm and the wavelength of the radio wave at the frequency of 50 GHz is equal to or smaller than 6.0 mm, it is surmised that, the bandwidth in which the return loss is greater than 20 dB is 10 GHz, that is, a high return loss greater than 20 dB is obtained in all region of the wavelength range at the frequency of 40 GHz to 50 GHz, the reflection on the surface of the absorber is prevented by the second radio wave absorption layer having a conical shape, and the radio wave absorber having excellent radio wave absorbability is obtained.

Meanwhile, in the radio wave absorbers 3 and 4 including the second radio wave absorption layer having a longer interval between protrusions than the wavelength of 6 mm of the radio wave at 50 GHz, the bandwidth in which the return loss is greater than 20 dB showed a small value, compared to the radio wave absorbers 1 and 2. From this point, in the radio wave absorbers 3 and 4 in which the interval of the protrusions is greater than the wavelength of the radio wave, the effect of preventing the reflection on the surface of the absorber obtained in the radio wave absorbers 1 and 2 is not sufficiently obtained. In addition, in the radio wave absorber 5 including only the absorption layer corresponding to the first margin plate-shaped radio wave absorption layer of Example 1 and not including the second radio wave absorption layer having a conical shape, the bandwidth in which the return loss is greater than 20 dB showed a small value, compared to the radio wave absorbers 1 and 2.

EXPLANATION OF REFERENCES 10, 20: radio wave absorber
12: support
14: first radio wave absorption layer (first radio wave absorption layer having a flat plate shape)
16, 22: second radio wave absorption layer (second radio wave absorption layer having a conical shape)
24: nozzle
26: second radio wave absorption layer formation composition
a: distance between apexes of adjacent conical protrusions (distance between apexes of adjacent conical protrusions of second radio wave absorption layer)

The contents of JP2017-068887 filed on Mar. 30, 2017 are incorporated herein by reference.

All of the documents, the patent applications, and the technology standards described here are incorporated here by reference.

What is claimed is:

1. A radio wave absorber comprising:
   a support;
   a first radio wave absorption layer having a flat plate shape that is disposed on a surface of the support and includes a radio wave absorption material and a binder;
   second radio wave absorption layers that are erected on a surface of the first radio wave absorption layer, include a radio wave absorption material and a binder, and are conical protrusions having bottom surfaces of which outer peripheral portions are in contact with each other, in which a distance between apexes of the conical protrusions adjacent to each other is 0.5 mm to $\lambda^a$ mm, in a case where a wavelength of a radio wave to be absorbed is set as $\lambda^a$ mm; and
   wherein a height of the conical protrusion of the second radio wave absorption layer is $0.5\lambda^a$ mm to $9\lambda^a$ mm, in a case where a wavelength of a radio wave to be absorbed is set as $\lambda^a$ mm.

2. The radio wave absorber according to claim 1, wherein the second radio wave absorption layer is formed of a single radio wave absorption layer formation composition including a radio wave absorption material and a binder.

3. The radio wave absorber according to claim 1, wherein the radio wave absorption material is a magnetic material.

4. A manufacturing method of a radio wave absorber, the method comprising:
   a step of forming a first radio wave absorption layer having a flat plate shape on a surface of a support by using a radio wave absorption layer formation composition including a radio wave absorption material;
   a step of ejecting a second radio wave absorption layer formation composition including a radio wave absorption material, a binder, and a solvent onto a surface of the first radio wave absorption layer from a nozzle, and moving the nozzle in a direction away from the surface of the first radio wave absorption layer, to form a second radio wave absorption layer having a conical shape; and
   wherein a height of a conical protrusion of the second radio wave absorption layer is $0.5\lambda^a$ mm to $9\lambda^a$ mm, in a case where a wavelength of a radio wave to be absorbed is set as $\lambda^a$ mm.

* * * * *